(12) United States Patent
Li et al.

(10) Patent No.: US 11,849,647 B2
(45) Date of Patent: Dec. 19, 2023

(54) NONMETALLIC LINER AROUND A MAGNETIC TUNNEL JUNCTION

(71) Applicant: INTERNATIONAL BUSINESS MACHINES CORPORATION, Armonk, NY (US)

(72) Inventors: Tao Li, Albany, NY (US); Yann Mignot, Slingerlands, NY (US); Ashim Dutta, Menands, NY (US); Tsung-Sheng Kang, Ballston Lake, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 17/249,521

(22) Filed: Mar. 4, 2021

(65) Prior Publication Data
US 2022/0285606 A1 Sep. 8, 2022

(51) Int. Cl.
*H10N 50/10* (2023.01)
*H10N 50/01* (2023.01)
*H10N 50/80* (2023.01)

(52) U.S. Cl.
CPC .............. *H10N 50/80* (2023.02); *H10N 50/01* (2023.02); *H10N 50/10* (2023.02)

(58) Field of Classification Search
CPC .............. G11C 11/15; H10N 52/00–85; H10N 50/00–80; H10B 61/00–22; H01L 23/544; H01L 2223/5446
See application file for complete search history.

(56) References Cited

U.S. PATENT DOCUMENTS

| | | | |
|---|---|---|---|
| 6,785,159 | B2 | 8/2004 | Tuttle |
| 9,466,792 | B2 | 10/2016 | Lin |
| 9,564,577 | B1 | 2/2017 | Hsu |
| 9,818,935 | B2 | 11/2017 | Chuang |
| 10,164,173 | B2 | 12/2018 | Hwang |
| 10,529,913 | B1 | 1/2020 | Chen |
| 10,559,751 | B1 | 2/2020 | Yang |

(Continued)

OTHER PUBLICATIONS

International Searching Authority, "Invitation to Pay Additional Fees and, Where Applicable, Protest Fee," Patent Cooperation Treaty, Jun. 29, 2022, 10 pages, International Application No. PCT/EP2022/053097.

(Continued)

*Primary Examiner* — Eric A. Ward
*Assistant Examiner* — Zachary Taylor Nix
(74) *Attorney, Agent, or Firm* — L. Jeffrey Kelly

(57) ABSTRACT

A semiconductor structure may include a magnetic tunnel junction layer on top and in electrical contact with a microstud, a hard mask layer on top of the magnetic tunnel junction layer, and a liner positioned along vertical sidewalls of the magnetic tunnel junction layer and vertical sidewalls of the hard mask layer. A top surface of the liner may be below a top surface of the hard mask layer. The semiconductor structure may include a spacer on top of the liner. The liner may separate the spacer from the magnetic tunnel junction layer and the hard mask layer. The semiconductor structure may include a first metal layer below and in electrical contact with the microstud and a second metal layer above the hard mask layer. A bottom portion of the second metal layer may surround a top portion of the hard mask layer.

19 Claims, 8 Drawing Sheets

(56) References Cited

U.S. PATENT DOCUMENTS

| | | |
|---|---|---|
| 2009/0209050 A1 | 8/2009 | Wang |
| 2010/0022030 A1 | 1/2010 | Ditizio |
| 2011/0121417 A1 | 5/2011 | Li |
| 2013/0119494 A1 | 5/2013 | Li |
| 2016/0013397 A1 | 1/2016 | Kitagawa |
| 2016/0133828 A1 | 5/2016 | Lu |
| 2016/0268336 A1* | 9/2016 | Shum ............... H10N 50/01 |
| 2016/0351792 A1* | 12/2016 | Jiang ............... G11C 11/5607 |
| 2016/0351797 A1* | 12/2016 | Yi ............... H10B 61/22 |
| 2017/0025601 A1* | 1/2017 | Bhushan ............... H10B 63/84 |
| 2017/0092850 A1 | 3/2017 | Lee |
| 2018/0033957 A1 | 2/2018 | Zhang |
| 2018/0130943 A1* | 5/2018 | Naik ............... H01F 10/14 |
| 2018/0261649 A1 | 9/2018 | Annunziata |
| 2019/0074440 A1 | 3/2019 | Yang |
| 2019/0280186 A1 | 9/2019 | Kashiwada |
| 2019/0326352 A1* | 10/2019 | Yi ............... H10N 50/10 |
| 2020/0006641 A1 | 1/2020 | Liou |
| 2020/0022068 A1* | 1/2020 | Ly ............... H04J 11/0073 |
| 2020/0266338 A1* | 8/2020 | Peng ............... H10N 50/01 |
| 2020/0373478 A1* | 11/2020 | Wang ............... H10N 50/80 |
| 2020/0403032 A1 | 12/2020 | Dutta |

OTHER PUBLICATIONS

Li, et al., "Nonmetallic Liner Around a Magnetic Tunnel Junction," Application and Drawings, Filed on Feb. 9, 2022, 23 Pages, Related US Patent Application Serial No. PCT/EP2022/053097.

* cited by examiner

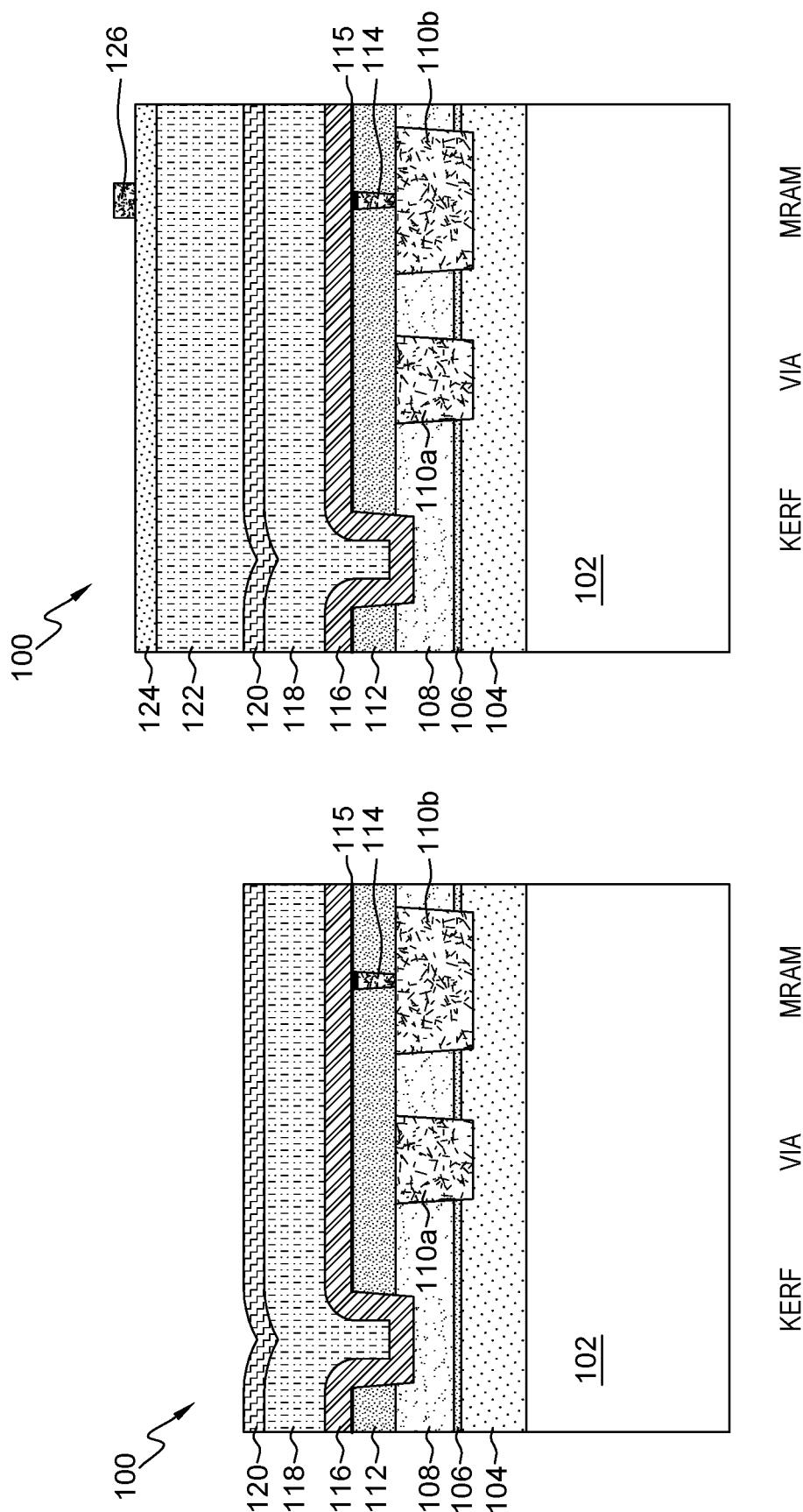

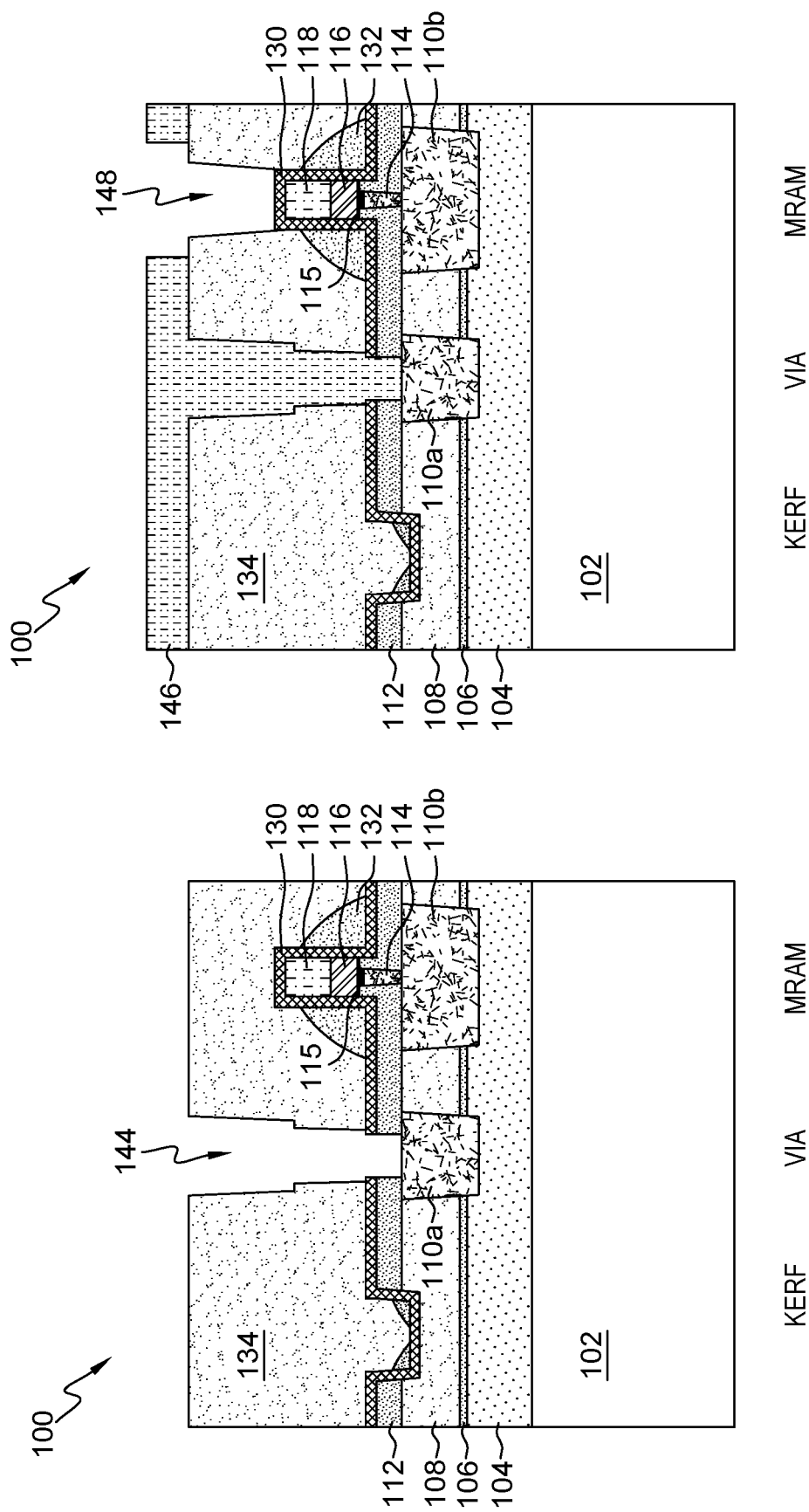

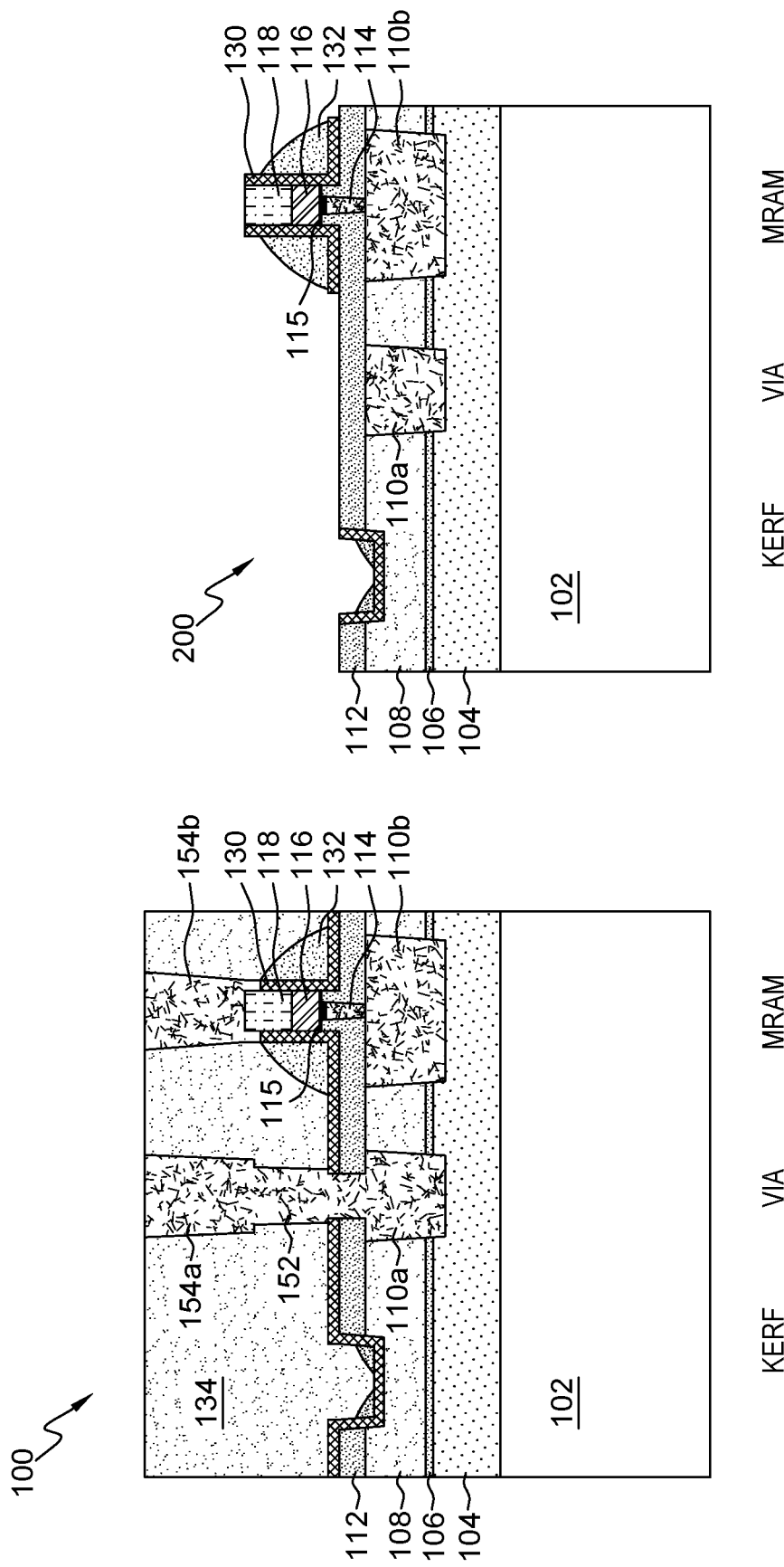

NONMETALLIC LINER AROUND A MAGNETIC TUNNEL JUNCTION

BACKGROUND

The present invention relates generally to a semiconductor structure and a method of forming the same. More particularly, the present invention relates to a semiconductor structure that includes a nonmetallic liner around a magnetic tunnel junction (MTJ) and a dielectric spacer deposited on top of the nonmetallic liner, around the MTJ.

MRAM is a non-volatile computer memory technology. MRAM data is stored by magnetic storage elements. The elements are formed from two ferromagnetic layers, each of which can hold a magnetic field, separated by a thin insulating layer. One of the two layers is a reference magnet set to a particular polarity, while the remaining layer's field can be changed to match that of an external field to store memory and is termed the "free magnet" or "free-layer". This configuration is known as the MTJ and is the simplest structure for a MRAM bit.

SUMMARY

According to one embodiment of the present invention, a semiconductor structure is provided. The semiconductor structure may include a magnetic tunnel junction layer on top and in electrical contact with a microstud, a hard mask layer on top of the magnetic tunnel junction layer, and a liner positioned along vertical sidewalls of the magnetic tunnel junction layer and vertical sidewalls of the hard mask layer. A top surface of the liner may be below a top surface of the hard mask layer. The semiconductor structure may include a spacer on top of the liner. The liner may separate the spacer from the magnetic tunnel junction layer and the hard mask layer. The semiconductor structure may include a first metal layer below and in electrical contact with the microstud and a second metal layer above the hard mask layer. A bottom portion of the second metal layer may surround a top portion of the hard mask layer. The semiconductor structure may include a first NBLok on top of an oxide layer and a second NBLok on top of a first interlayer dielectric. The first interlayer dielectric may separate the first NBLok from the second NBLok. The liner may extend laterally along a portion of a top surface of the second NBLok. The semiconductor structure may also include a second interlayer dielectric on top of the liner. The liner may separate the second interlayer dielectric from the second NBLok.

According to another embodiment of the present invention, a semiconductor structure is provided. The semiconductor structure may include a magnetic tunnel junction layer on top and in electrical contact with a microstud, a hard mask layer on top of the magnetic tunnel junction layer, and a liner positioned along vertical sidewalls of the magnetic tunnel junction layer and vertical sidewalls of the hard mask layer. A top surface of the liner may be substantially flush with a top surface of the hard mask layer. The semiconductor structure may include a spacer on top of the liner. The liner may separate the spacer from the magnetic tunnel junction layer and the hard mask layer. The semiconductor structure may include a first metal layer below and in electrical contact with the microstud and a second metal layer directly above the hard mask layer. The semiconductor structure may include a first NBLok on top of an oxide layer and a second NBLok on top of a first interlayer dielectric. The first interlayer dielectric may separate the first NBLok from the second NBLok. The liner may extend laterally along a portion of a top surface of the second NBLok. The semiconductor structure may include a second interlayer dielectric on top of the liner. The liner may separate the second interlayer dielectric from the second NBLok.

According to another embodiment of the present invention, a method is provided. The method may include forming a magnetic tunnel junction layer on top of a microstud, forming a hard mask layer on top of the magnetic tunnel junction layer, and conformally depositing a liner on top of the hard mask layer. The liner may be positioned along vertical sidewalls of the magnetic tunnel junction layer and vertical sidewalls of the hard mask layer. A top surface of the liner may be below a top surface of the hard mask layer. The magnetic tunnel junction layer may be in electrical contact with the microstud. The method may include forming a spacer on top of the liner. The liner may separate the spacer from the magnetic tunnel junction layer and the hard mask layer. The method may include forming a first metal layer below and in electrical contact with the microstud and forming a second metal layer above the hard mask layer. A bottom portion of the second metal layer may surround a top portion of the hard mask layer. The method may include forming a first NBLok on top of an oxide layer and forming a second NBLok on top of a first interlayer dielectric. The first interlayer dielectric may separate the first NBLok from the second NBLok. The liner may extend laterally along a portion of a top surface of the second NBLok. The method may include forming a second interlayer dielectric on top of the liner. The liner may separate the second interlayer dielectric from the second NBLok.

BRIEF DESCRIPTION OF THE DRAWINGS

The following detailed description, given by way of example and not intend to limit the invention solely thereto, will best be appreciated in conjunction with the accompanying drawings, in which:

FIG. 1 is a cross section view illustrating an oxide layer, a first and second NBLok, a magnetic tunnel junction (MTJ) layer and a hard mask layer arranged on an underlayer according to an exemplary embodiment;

FIG. 2 is a cross section view illustrating an organic planarization layer (OPL), an antireflective coating layer, and a photoresist cap formed according to an exemplary embodiment;

FIG. 7 is a cross section view illustrating forming a first trench above a first metal layer according to an exemplary embodiment;

FIG. 8 is a cross section view illustrating forming a second trench above the MTJ pillar according to an exemplary embodiment;

FIG. 11 is a cross section view illustrating a via and a second metal layer according to an exemplary embodiment;

FIG. 12 is a cross section view illustrating forming a spacer on top of the liner according to an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figures 3, 4:
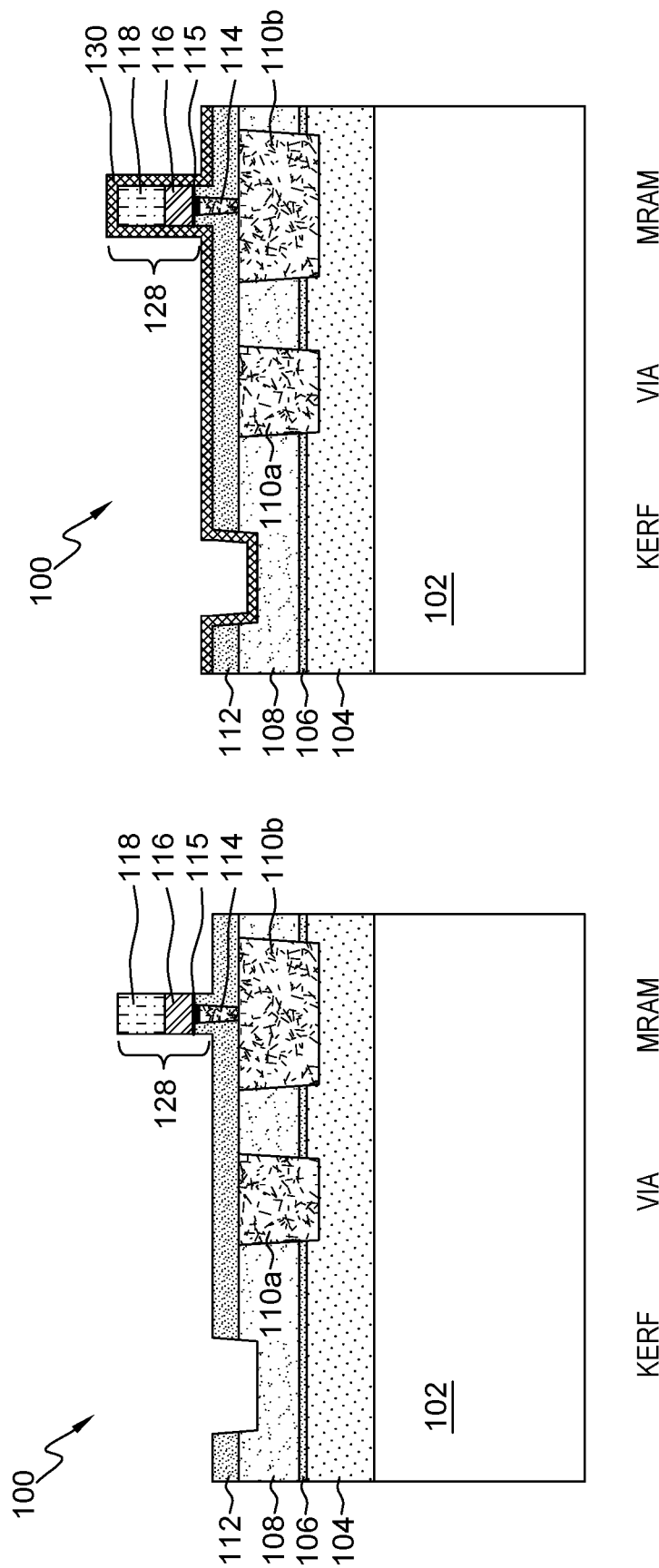
FIG. 3 is a cross section view illustrating a MTJ pillar according to an exemplary embodiment.
FIG. 4 is a cross section view illustrating forming a liner around the MTJ pillar according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present invention relates to a semiconductor structure that includes a nonmetallic liner around a magnetic tunnel junction (MTJ) and a dielectric spacer deposited on top of the nonmetallic liner, around the MTJ. Both the dielectric spacer and the nonmetallic liner may prevent subsequent via over etch, thus preventing the MTJ from contacting a top metal layer and creating a short.

MRAM is a non-volatile random-access memory technology. Data in MRAM is not stored as electric charge or current flows, but by magnetic storage elements. The elements are formed from ferromagnetic plates typically comprised of a magnetic tunnel junction (MTJ) material. Each of the plates hold a magnetization, separated by a thin insulating layer. In some MRAMs, one of the two plates is a permanent magnet set to a particular polarity, while the other plate magnetization is variable, so that it can be changed to match that of an external electromagnetic field to store memory.

As the dimensions of an MRAM device have become smaller, challenges have been experienced to provide an adequate top contact structure. One of the problems is that during the formation of the MRAM top contact landing, a spacer surrounding the MTJ may be over etched. When the spacer is over etched, the MTJ is exposed to a top metal layer, thus creating a short in the MRAM device. As a result, there exists a need to fabricate a MRAM device that has an improved MRAM top contact landing. The present disclosure presents a method and structure to address the above described problem. More particularly, embodiments of the present invention relate to a method and semiconductor structure that includes a nonmetallic liner around the MTJ of the MRAM top contact landing. The nonmetallic liner is formed at the sidewalls of the MTJ, thus protecting the MTJ from contacting the top metal layer.

FIGS. 1-15 illustrate a method of making a semiconductor structure that includes a nonmetallic liner surrounding the MTJ and a dielectric spacer deposited on top of the nonmetallic liner, around the MTJ. Both the dielectric spacer and the nonmetallic liner may prevent subsequent via over etch, thus preventing the MTJ from contacting a top metal layer.

Referring now to FIG. 1, a structure 100 is shown, in accordance with an embodiment. The structure 100 may include an underlayer 102, an oxide layer 104, a first NBLok or nitrogen and hydrogen doped silicon carbide 106, a first interlayer dielectric (ILD) 108, first metal layers 110a, 110b, a second NBLok 112, a microstud 114, a conducting metal layer 115, a magnetic tunnel junction (MTJ) layer 116, a hard mask layer 118, and a dielectric layer 120. The underlayer 102 may refer to an underlying stack of a semiconductor wafer. The oxide layer 104 separates the underlayer 102 from the first NBLok 106. Non-limiting examples of materials for the oxide layer 104 may include silicon dioxide, tetraethylortho silicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof, on the underlayer 102.

After the oxide layer 104 is deposited, the first NBLok 106 is deposited on top of the oxide layer 104. The first ILD 108 is then deposited on top of the first NBLok 106 using known deposition techniques, such as, for example, ALD, chemical vapor deposition (CVD), or physical vapor deposition (PVD). The first ILD 108 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. After the first ILD 108 is deposited, the first metal layers 110a, 110b, are formed within the ILD 108, using know techniques. The first metal layers 110a, 110b extend from a top surface of the ILD 108 through the ILD 108, the first NBLok 106, to the oxide layer 104. The first metal layers 110a, 110b are made of metal, such as, for example copper.

After the first metal layers 110a, 110b are formed, the second NBLok 112 is deposited. Both the first and second NBLok 106, 112 are barrier films used in semiconductor chips. The first and second NBLok 106, 112 may be made of nitrogen doped silicon carbide or carbon doped silicon nitride. The first and second NBLok 106, 112 may be formed on the oxide layer 104 and the first ILD 108, respectively, using standard deposition methods. The microstud 114 is then formed within the second NBLok 112. An opening is first patterned and then filled with metal, such as, for example, copper, to form the microstud 114.

In addition to the microstud 114, a kerf is also formed within the second NBLok 112. The kerf is slit made within the second NBLok 112 that may be used to align additional layers deposited on top of the structure 100 during subsequent processing. After the kerf is formed, the metal layer 115 is deposited on top of the structure 100. The metal layer 115 may consist of single or multiple layers of metal deposited using PVD, CVD, or PECVD. Some example material for the metal layer 115 may include, but is not limited to, TaN, TiN, other common metals or any combination thereof.

After the metal layer 115 is deposited, the magnetic tunnel junction (MTJ) layer 116 is deposited on top of the structure 100. The MTJ layer 116 may include a seed layer, fixed magnetic layers, free magnetic layers, tunnel barrier(s), oxide cap(s), etc. The tunnel barrier should be sufficiently thin to allow for electrons to tunnel from one ferromagnet into another, in accordance with tunnel magnetoresistance (TMR). For example, the tunnel barrier may have a thickness of, for example, about a few nanometers. A tunnel barrier may include any suitable insulator material in accordance with the embodiments described herein. Examples of suitable insulator materials include, but are not limited to, magnesium oxide (MgO) and aluminum oxide ($Al_2O_3$). The MTJ layer 116 may be fabricated using one or more thin film technology processes. For example, the MTJ layer 116 may be fabricated using one or more of, for example, sputter deposition, molecular beam epitaxy, pulsed laser deposition, and any type of physical vapor deposition (PVD).

With continued reference to FIG. 1, both the hard mask layer 118 and the dielectric layer 120 are subsequently deposited on top of the MTJ layer 116. As a result, the hard mask layer 118 separates the MTJ layer 116 from the dielectric layer 120. The hard mask layer 118 may be made of titanium nitride. The hard mask layer 118 may also include any dielectric material such as, for example, silicon dioxide, silicon nitride and/or silicon oxynitride. The dielectric layer 120 may be made of dielectric material, such as, for example, tetraethylorthosilicate layer (TEOS). In some embodiments, both the hard mask layer 118 and the dielectric layer 120 may be formed utilizing a conventional deposition process such as, for example, chemical vapor deposition (CVD), plasma enhanced chemical vapor deposition (PECVD), PVD, or ALD.

As illustrated in FIG. 1, the structure 100 may include three particular regions, the kerf region, a via region, and a MRAM region. The kerf may be used to align a photoresist mask for MTJ layer 116 patterning. Since the MTJ layer 116, the hard mask layer 118, and the dielectric layer 120 are thick, their reflective index is low. As a result, the alignment, or overlay, of the photoresist mask with respect to the microstud 114 is not adequate enough to pattern the MTJ layer 116 right above the microstud 114. Therefore, the kerf is used to properly align the photoresist mask such that the mask is placed right above the area where the microstud 114 is located. The via region is a region within the structure 100 which may include a via connection. The MRAM region is a region within the structure 100 which may include the MRAM device. It should be appreciated that even though one kerf, one via, and one MRAM region is illustrated, the structure 100 may include a plurality of kerf, via, and MRAM regions.

Referring now to FIG. 2, the structure 100 with an organic planarization layer (OPL) 122, an antireflective coating layer 124, and a photoresist cap 126 is shown, in accordance with an embodiment. Beginning with the structure 100 of FIG. 1, the OPL 122 is deposited on the top surfaces of the dielectric layer 120. The antireflective coating layer 124 is then deposited on top of the OPL 122. The antireflective coating layer 124 may be a bottom antireflective coating (BARC) or a silicon containing antireflective coating (SiARC). A photoresists layer (not shown) is then deposited on top of the antireflective coating layer 124. The OPL 122, the antireflective coating layer 123, and the photoresist layer may each be deposited using known deposition techniques, such as, for example, spin-on coating. The structure 100 then undergoes a lithography process to form the photoresist cap 126 on top of the antireflective coating layer 124. Utilizing the kerf, the photoresists mask is aligned to the topography of the microstud 114, allowing for the photoresist cap 126 to be formed above the microstud 114. This allows for an MTJ pillar to be formed above the microstud 114 in subsequent fabrication steps.

Referring now to FIG. 3, the structure 100 with a MTJ pillar 128 is shown, in accordance with an embodiment. After the photoresist cap 126 is formed on top of the antireflective coating layer 124, the structure 100 undergoes an etch process, such as, for example, a reactive ion etch or ion beam etch. The etch process removes the antireflective coating layer 124, the OPL 122, the dielectric layer 120, the hard mask layer 118, the MTJ layer 116, and the metal layer 115. The etch process also recesses less than 10 nm of the second NBLok 112 from the top. As a result, the MTJ pillar 128 forms after pattern transfer.

The MTJ pillar 128 may extend from the top surface of the hard mask layer 118 to the top portion of the second NBLok 112. The MTJ pillar 128 may include the hard mask layer 118, the MTJ layer 116, and the top portion of the second NBLok 112. The MTJ pillar 128 may be located directly above the microstud 114, within the MRAM region of the structure 100. The MTJ layer 116 may be in electrical contact with the microstud 114.

Referring now to FIG. 4, the structure 100 with a liner 130 is shown, in accordance with an embodiment. After the MTJ pillar 128 is formed, the liner 130 is conformally deposited onto the top surface of the structure 100. The liner 130 may be deposited using known deposition techniques, such as, for example, ALD. The liner 130 may be referred to as the nonmetallic liner and may be made of an insulating material, such as, for example, silicon nitride. Other non-limiting examples of materials for the liner 130 may include dielectric oxides (e.g., silicon oxide), dielectric nitrides (e.g., silicon nitride), dielectric oxynitrides, or any combination thereof. The liner 130 may have a thickness of about 5 to about 20 nm.

The liner 130 is conformally deposited along the sidewalls of the MTJ pillar 128. As a result, the liner 130 protects the MTJ pillar 128 from damage during subsequent manufacturing steps. The liner 130 surrounds the sidewalls of the MTJ layer 116 and separates the MTJ layer 116 from the metal layer that may be subsequently deposited on top of the MTJ pillar 128. As a result, the liner 130 prevents the occurrence of a short in the MRAM device.

Figures 5, 6:
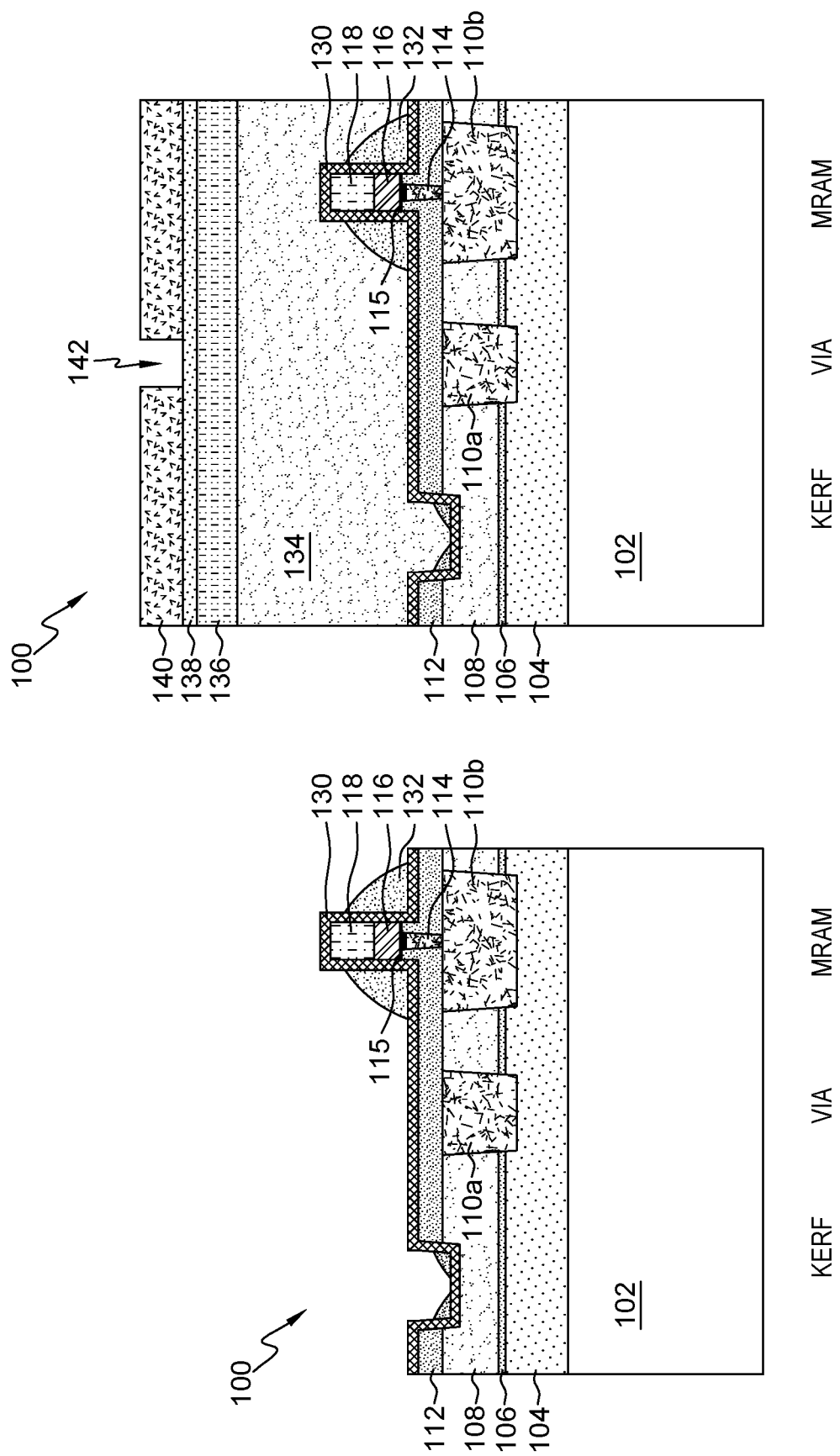
FIG. 5 is a cross section view illustrating forming a spacer on top of the liner according to an exemplary embodiment.
FIG. 6 is a cross section view illustrating depositing a second organic planarization layer (OPL), a second antireflective coating layer, and a photoresist layer according to an exemplary embodiment.

Referring now to FIG. 5, the structure 100 with a spacer 132 surrounding the MTJ pillar 128 is shown, in accordance with an embodiment. After the liner 130 is conformally deposited on top of the structure 100, a spacer layer (not shown) is deposited on top of the liner 130 such that the liner 130 is covered by the spacer layer. The spacer layer may be deposited to a thickness that surpasses the height of the MTJ pillar 128, thus covering the MTJ pillar 128. The spacer layer may be made of a nitride material, such as, for example, aluminum nitride. Subsequently after its deposition, the spacer layer is etched.

In an embodiment, an etch process, such as, for example, an atomic layer etch, may be used to selectively etch the spacer layer, forming the spacer 132 surrounding the MTJ pillar 128, without removing the liner 130. As a result, the spacer extends from an upper portion of the MTJ pillar 128 to the top surface of the liner 130. The spacer 132 also extends laterally along the top surface of the liner 130 and overlaps the first metal layer 110b. In an embodiment, some spacer layer also remains on the bottom and along the bottom sidewall portions of the kerf.

Referring now to FIGS. 6 and 7, the structure 100 with a second ILD 134 is shown, in accordance with an embodiment. Once the spacer 132 is formed around the MTJ pillar 128, the second ILD 134 is deposited onto the top surface of the structure 100. The second ILD 134 is deposited using known deposition techniques, such as, for example CVD, PVD, plasma enhanced CVD, evaporation, chemical solution deposition, or like processes. The second ILD 134 may be formed from the same materials that are used to form the first ILD 108. The second ILD 134 is deposited to a thickness where a top surface of the second ILD 134 covers the top surface of the liner 130 that is positioned on the top surface of the MTJ pillar 128.

The structure 100 undergoes further processing where a second OPL 136 is deposited on a top surface of the second ILD 134, followed by a deposition of a second antireflective coating layer 138 on top of the second OPL 136. The second OPL 136 may be deposited using the same deposition techniques as used during the deposition of the first OPL 122. The second OPL 136 may be made of the same material as the first OPL 122. The second antireflective coating layer 138 may be made of the same material as the first antireflective coating layer 124 and may be deposited onto the second OPL 136 using known deposition techniques.

In addition to the second OPL 136 and the second antireflective coating layer 138, a photoresist layer 140 is deposited onto the top surface of the second antireflective coating layer 138. The photoresist layer 140 is patterned to form an opening 142. The opening 142 extends from the top surface of the photoresist layer 140 to the top surface of the second antireflective coating layer 138. The structure 100 then undergoes an etch process, such as, for example, a RIE process, to form a first trench 144, as shown in FIG. 7. The first trench 144 extends from the top surface of the second ILD 134 to the exposed top surface of the first metal layer 110a.

Referring now to FIG. 8, the structure 100 with a second trench 148 is shown, in accordance with an embodiment. After the first trench 144 is formed, a third OPL 146 is deposited, using known deposition techniques, on the top surface of the structure 100, filling the trench 144. The structure 100 undergoes further processing where an anti-reflective coating layer and a photoresist layer are subsequently deposited. The photoresist layer is patterned and an etch process, such as, for example, a RIE process, is used to remove portions on the second ILD 134 above the MTJ pillar, forming the second trench 148. The second trench 148 extends from the top surface of the second ILD 134 to the exposed top surface of the liner 130. The etch process is selective to the liner 130. As a result, the second ILD 134 is removed without also removing the liner 130.

Figure 9:
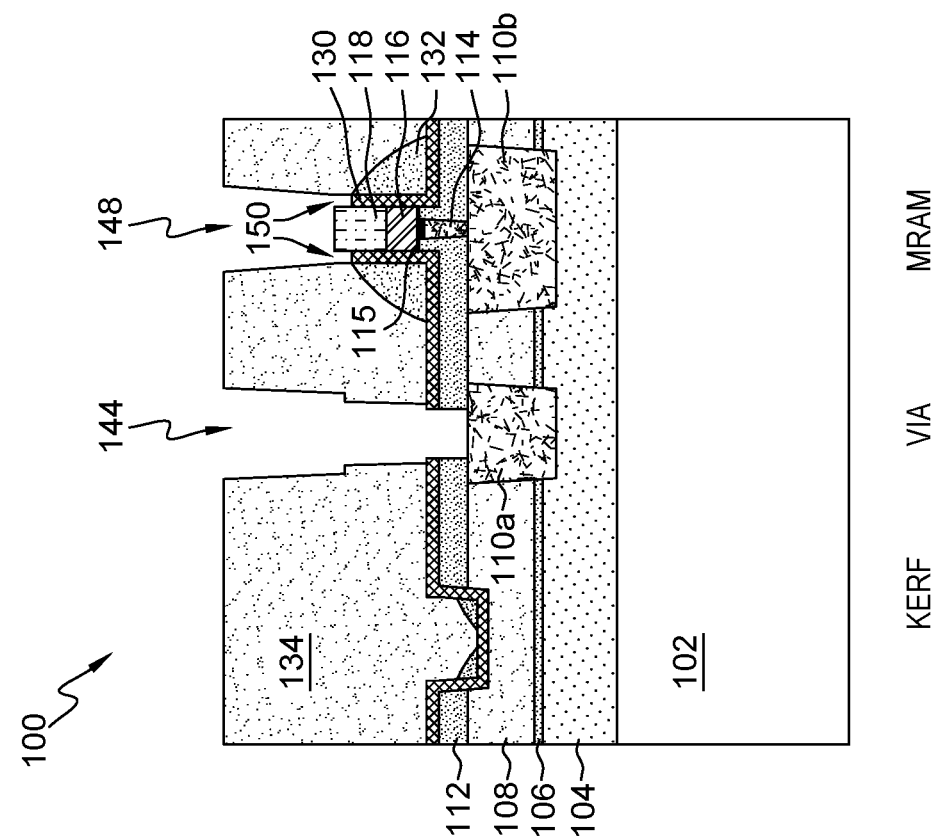
FIG. 9 is a cross section view illustrating removing portions of the liner to form an opening around a top portion of the hard mask layer according to an exemplary embodiment.

Referring now to FIG. 9, the structure 100 with the top surface of the hard mask layer 118 exposed is shown, in accordance with an embodiment. An etch process, such as, for example, a methyl fluoride or fluoromethane (CH$_3$F) etch may be used to selectively etch the liner 130 that surrounds the top sidewall portions and the top surface of the hard mask layer 118. The CH$_3$F etch process removes the liner 130 without also removing the hard mask layer 118 and provides better uniformity across the whole wafer. Generally, the etch rate is affected by the critical dimensions (CD) of the etched structure. In this process, the etch CD is a fixed value which is the liner thickness determined by the ALD process. This significantly improves recess rate uniformity and in turn improves the structure uniformity across the whole wafer.

Removing the liner 130 from the top sidewall portions of the hard mask layer 118, forms an opening 150 between a sidewall of the second ILD 134 and the sidewall of the hard mask layer 118. The top surface of the liner 130 extends above the top surface of the MTJ layer 116 but below the top surface of the hard mask layer 118. In an embodiment, the opening 150 is the area extending from the top surface of the liner 130 to the top surface of the hard mask layer 118. In an embodiment, the opening 150 may extend downward along the sidewalls of the hard mask layer 118 such that the bottom of the opening is above the bottom surface of the hard mask layer 118.

Figure 10:
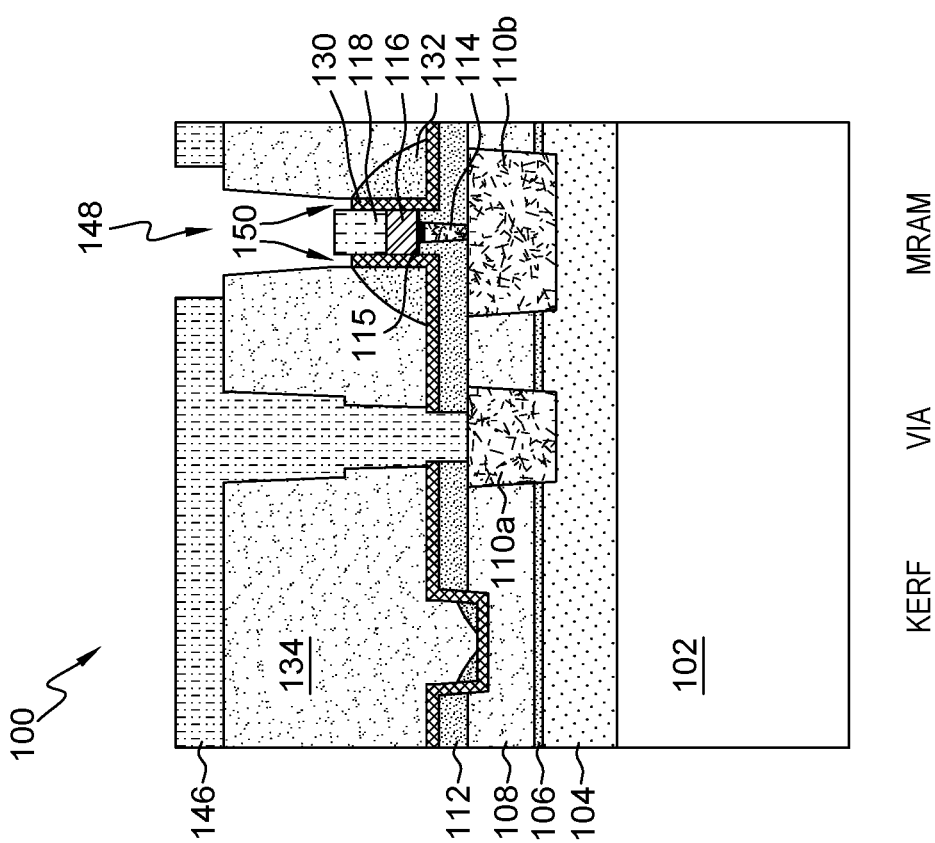
FIG. 10 is a cross section view illustrating removing the OPL to open the first trench according to an exemplary embodiment.

Referring now to FIG. 10, the structure 100 with the first and second trenches 144, 148 opened is shown, in accordance with an embodiment. An OPL ash process may be used to remove the second OPL 136 from the top surface of the structure 100 and the first trench 144, thereby preparing the structure 100 for subsequent steps of fabrication. The first trench 144 extends from the top surface of the second ILD 134, through the liner 130 and the second NBLok 112, to the exposed top surface of the first metal layer 110a. The second trench 148 extends from the top surface of the second ILD 134 to the exposed top surface of the hard mask layer 118. In addition, the second trench 148 also includes the openings 150, which are described in more detail with respect to FIG. 9.

Referring now to FIG. 11, the structure 100 with a via 152 and a second metal layer 154 a, b is shown, in accordance with an embodiment. The structure 100 undergoes a metallization process during which the first and second trenches 144, 148 are lined with a liner material and then filled with a conductive material or a combination of conductive materials to form the via 152 and the second metal layer 154a, b. The conductive material may be a conductive metal, for example, copper. The conductive material may be deposited by a suitable deposition process, for example, CVD, PECVD, PVD, plating, thermal or e-beam evaporation, or sputtering. A planarization process, for example, CMP, is performed to remove any conductive material from the surface of the second ILD 134.

During the metallization process, the conductive material fills the opening 150, described herein with reference to FIG. 9, forming a cap around the top portion of the hard mask layer 118. The cap is formed by the bottom portion of second metal layer 154b surrounding a top portion of the hard mask layer 118.

FIGS. 1-11 provide a method of fabricating a semiconductor structure (the structure 100) that includes the liner 130 around the MTJ layer 116. The liner 130 surrounds the MTJ layer 116 and protects the MTJ layer 116 from direct contact with the second metal layer 154b. When the MTJ layer 116 touches the second metal layer 154b, a short is created in the MRAM device, making the MRAM device unreliable. As stated herein above, the MRAM is composed of two ferromagnetic plates, each of which can hold a magnetization, separated by a thin insulating layer. One of the two plates is a permanent magnet set to a particular polarity; the other plate's magnetization can be changed to match that of an external field to store memory. When a short is created in the device, the plate that is supposed to be able to change magnetization will always point to one magnet direction. As a result, the MRAM device becomes unfunctional.

Another embodiment by which to fabricate a semiconductor structure that includes the liner 130 around the MTJ layer 116 is described in detail below by referring to the accompanying FIGS. 12-15. In the present embodiment, the liner 130 is removed from the top surface of the second NBLok 112 and top surface of hard mask layer 118.

Referring now to FIG. 12, a structure 200 is shown at an intermediate state of fabrication after the spacer layer is etched to form the spacer 132 (as described above with respect to FIG. 5), in accordance with an embodiment of the present invention. The structure 200 may be substantially similar in all respects to the structure 100 described in detail above with respect to FIG. 5; however, in the present embodiment, the structure 200 includes the liner 130 only within the kerf, around the MTJ pillar 128 and underneath spacer 132.

Beginning with the structure 100 of FIG. 4, the spacer layer (not shown) is deposited, using known deposition techniques, on top of the liner 130 to a thickness such that the MTJ pillar 128 is buried within the spacer layer. Using an etch process, such as, for example, a RIE process, the spacer layer is etched, forming the spacer 132. In addition to the spacer layer, the liner 130 is also etched such that it is removed from the top surface of the second NBLok 112 and top surface of hard mask layer 118, thereby exposing the top surface of the second NBLok 112 and top surface of hard mask layer 118.

The etch process does not remove the liner 130, along with some spacer layer, within the kerf. In addition, the liner 130 remains along the sidewalls of the MTJ pillar 128, underneath the spacer 132. The liner 130 extends laterally along the top surface of the second NBLok 112 and overlaps the first metal layer 110b. The etch process removes the liner 130 from the top surface of the hard mask layer 118, thereby exposing the top surface of the hard mask layer 118. After the liner 130 is etched and the spacer 132 is formed, the structure 200 undergoes subsequent steps of manufacturing described in detail with respect to FIGS. 6-7.

Figures 13, 14:
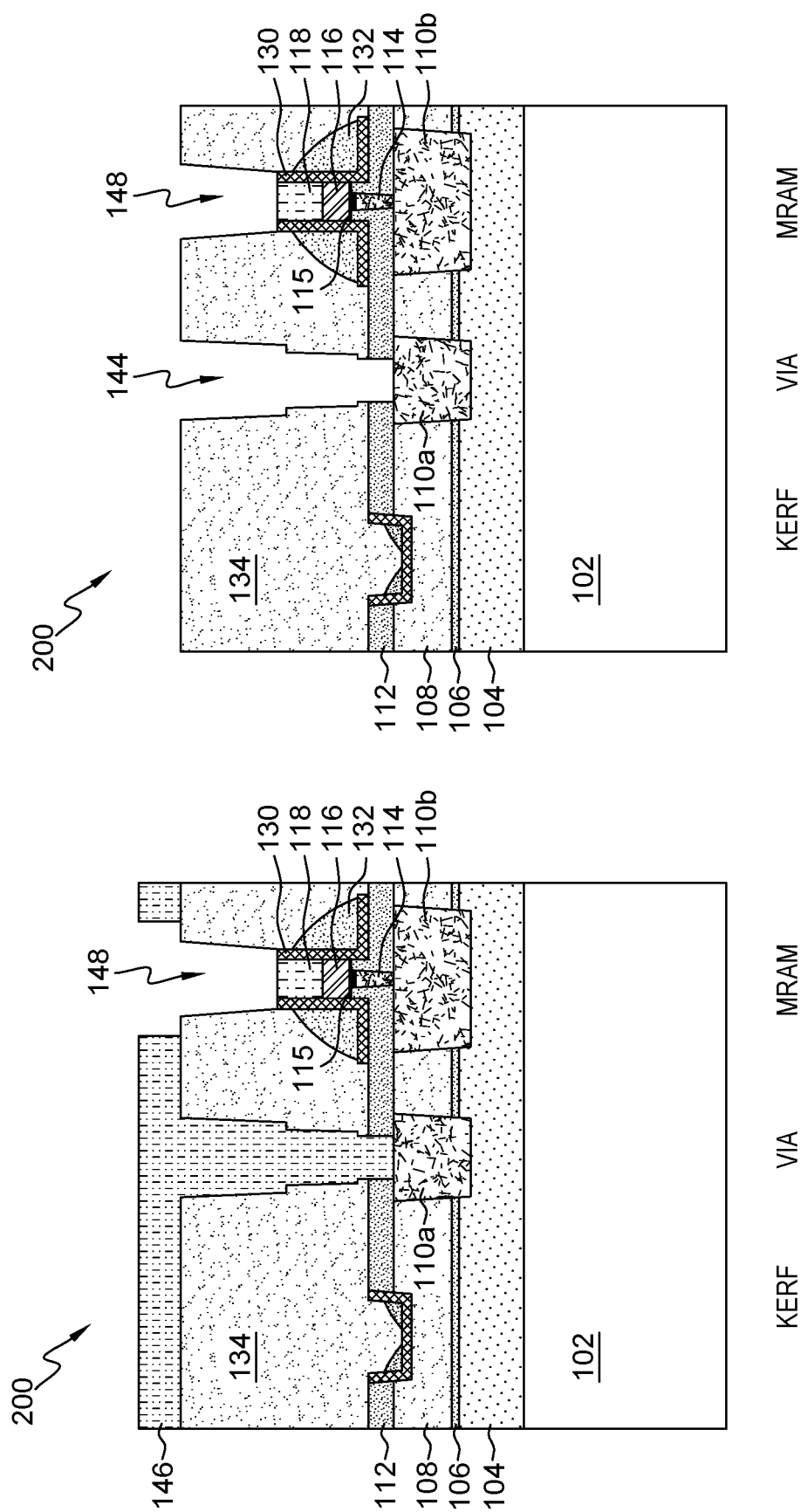
FIG. 13 is a cross section view illustrating forming a second trench above the MTJ pillar according to an exemplary embodiment.
FIG. 14 is a cross section view illustrating removing the OPL to open the first trench according to an exemplary embodiment.

Referring now to FIG. 13, the structure 200 with the second trench 148 is shown, in accordance with an embodiment of the present invention. The structure 200 is substantially similar to the structure 100, illustrated in FIG. 8; however, the structure 200 does not include the liner 130 on the top surface of the hard mask layer 118. Rather, the top surface of the hard mask layer 118, within the second trench 148 of the structure 200, is exposed.

Referring now to FIG. 14, the structure 200 with the first and second trenches 144, 148 is shown, in accordance with an embodiment of the present invention. An OPL ash process may be used to remove the third OPL 146 from the top surface of the structure 200 and the first trench 144, thereby preparing the structure 200 for subsequent steps of fabrication. The first trench 144 extends from the top surface of the second ILD 134 and the second NBLok 112, to the exposed top surface of the first metal layer 110a. The second trench 148 extends from the top surface of the second ILD 134 to the exposed top surface of the hard mask layer 118.

The second trench 148, illustrated in FIG. 14, does not include the opening 150 that is illustrated in FIG. 10. Rather, FIG. 14 illustrates the top surface of the hard mask layer 118, within the second trench 148, being substantially flush with the top surface of the liner 130.

Figure 15:
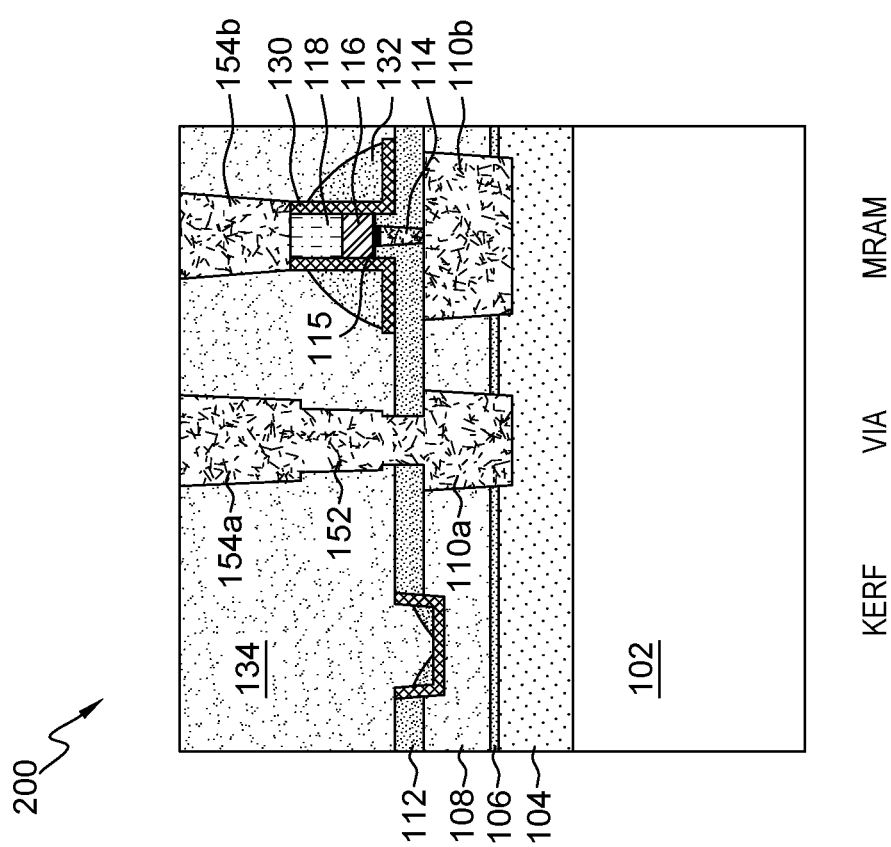
FIG. 15 is a cross section view illustrating a via and a second metal layer according to an exemplary embodiment.

Referring now to FIG. 15, the structure 200 with the via 152 and the second metal layer 154a, b is shown, in accordance with an embodiment. The structure 200 undergoes a metallization process during which the first and second trenches 144, 148 are lined with a liner material and then filled with a conductive material or a combination of conductive materials to form the via 152 and the second metal layer 154a, b. The conductive material may be a conductive metal, for example, copper. The conductive material may be deposited by a suitable deposition process, for example, CVD, PECVD, PVD, plating, thermal or e-beam evaporation, or sputtering. A planarization process, for example, CMP, is performed to remove any conductive material from the surface of the second ILD 134.

The resultant structure 200 of FIG. 15 includes the liner 130. However, the liner 130 does not extend laterally over the whole top surface of the second NBLok 112, as is illustrated in the structure 100 of FIG. 11. Rather, the liner 130 is etched such that it remains within the kerf, around the MTJ pillar 128, and underneath the spacer 132. The liner 130 surrounds the MTJ pillar 128 and extends from the top surface of the hard mask layer 118 to the top surface of the second NBLok 112. The liner 130 also partially extends laterally over the second NBLok 112, within the vicinity of the MTJ pillar 128, and separates the MTJ pillar 128 and the second NBLok 112 from the spacer 132.

Having the liner 130 surrounding the sidewalls of the MTJ layer 116 and the sidewalls of the MTJ pillar 128 creates sidewall protection. During the manufacturing process, the spacer layer may be over-etched, creating the spacer 132 whose top surface is below the top surface of the MTJ layer 116. As a result, the sidewalls of the MTJ layer 116 are exposed and may contact the second metal layer 154b, thereby creating a short in the MRAM region. The liner 130 that surrounds the MTJ pillar 128 and the sidewalls of the MTJ layer 116 acts as a barrier and separates the sidewalls of the MTJ layer 116 from contacting the second metal layer 154b.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a magnetic tunnel junction layer on top and in electrical contact with a microstud;
   a hard mask layer on top of the magnetic tunnel junction layer; and
   a liner positioned along vertical sidewalls of the magnetic tunnel junction layer and vertical sidewalls of the hard mask layer, wherein a top surface of the liner is substantially flush with a top surface of the hard mask layer, wherein the liner is present only in a kerf region and a memory region.

2. The semiconductor structure of claim 1, further comprising:
   a spacer on top of the liner, wherein the liner separates the spacer from the magnetic tunnel junction layer and the hard mask layer.

3. The semiconductor structure of claim 1, further comprising:
   a first metal layer below and in electrical contact with the microstud; and
   a second metal layer directly above the hard mask layer.

4. The semiconductor structure of claim 1, further comprising:
   a first nitrogen and hydrogen doped silicon carbide layer on top of an oxide layer; and
   a second nitrogen and hydrogen doped silicon carbide layer on top of a first interlayer dielectric, wherein the first interlayer dielectric separates the first nitrogen and hydrogen doped silicon carbide layer from the second nitrogen and hydrogen doped silicon carbide layer.

5. The semiconductor structure of claim 4, wherein the liner extends laterally along a portion of a top surface of the second nitrogen and hydrogen doped silicon carbide layer.

6. The semiconductor structure of claim 4, further comprising:
   a second interlayer dielectric on top of the liner, wherein the second interlayer dielectric layer directly contacts at least a portion of a top surface of the second nitrogen and hydrogen doped silicon carbide layer, and wherein the liner separates the second interlayer dielectric from at least a portion of the second nitrogen and hydrogen doped silicon carbide layer.

7. A semiconductor structure comprising:
   a magnetic tunnel junction layer on top and in electrical contact with a microstud;
   a hard mask layer on top of the magnetic tunnel junction layer; and
   a liner positioned along vertical sidewalls of the magnetic tunnel junction layer and vertical sidewalls of the hard mask layer, wherein a first portion of the liner located in a kerf region is entirely below a second portion of the liner located in a memory region, wherein a bottom surface of the second portion of the liner located in the memory region is below a top surface of the microstud.

8. The semiconductor structure of claim 7, further comprising:
   a spacer on top of the liner, wherein the liner separates the spacer from the magnetic tunnel junction layer and the hard mask layer.

9. The semiconductor structure of claim 7, further comprising:
   a first metal layer below and in electrical contact with the microstud; and
   a second metal layer directly above the hard mask layer.

10. The semiconductor structure of claim 7, further comprising:
    a first nitrogen and hydrogen doped silicon carbide layer on top of an oxide layer; and
    a second nitrogen and hydrogen doped silicon carbide layer on top of a first interlayer dielectric, wherein the first interlayer dielectric separates the first nitrogen and hydrogen doped silicon carbide layer from the second nitrogen and hydrogen doped silicon carbide layer.

11. The semiconductor structure of claim 10, wherein the second portion of the liner located in the memory region directly contacts a top surface of the second nitrogen and hydrogen doped silicon carbide layer.

12. The semiconductor structure of claim 10, further comprising:
    a second interlayer dielectric on top of the liner, wherein the second interlayer dielectric layer directly contacts at least a portion of a top surface of the second nitrogen and hydrogen doped silicon carbide layer, and wherein the liner separates the second interlayer dielectric from at least a portion of the second nitrogen and hydrogen doped silicon carbide layer.

13. A semiconductor structure comprising:
    a microstud embedded in a first nitrogen and hydrogen doped silicon carbide layer;
    a magnetic tunnel junction on top and in electrical contact with the microstud;
    a hard mask layer on top of the magnetic tunnel junction;
    a first nonmetallic liner located in a memory region and positioned along a top surface of the first nitrogen and hydrogen doped silicon carbide layer and vertical sidewalls of the magnetic tunnel junction; and
    a second nonmetallic liner positioned within a trench in a kerf region, wherein the first nonmetallic liner and the second nonmetallic liner are composed of identical materials, and wherein the second nonmetallic liner is entirely below the first nonmetallic liner.

14. The semiconductor structure of claim 13, further comprising:
    a second nitrogen and hydrogen doped silicon carbide layer beneath the first nitrogen and hydrogen doped silicon carbide layer; and
    a first interlayer dielectric separates the first nitrogen and hydrogen doped silicon carbide layer from the second nitrogen and hydrogen doped silicon carbide layer.

15. The semiconductor structure of claim 13, further comprising:
    a first spacer directly on the first nonmetallic liner in the memory region; and
    a second spacer directly on the second nonmetallic liner within the trench in the kerf region.

16. The semiconductor structure of claim 13, wherein a width of the microstud is less than a width of the magnetic tunnel junction.

17. The semiconductor structure of claim 13, wherein the first nitrogen and hydrogen doped silicon carbide layer is entirely below the magnetic tunnel junction.

18. The semiconductor structure of claim 13, wherein a first portion of the first nitrogen and hydrogen doped silicon carbide layer directly beneath the magnetic tunnel junction is taller than a second portion of the first nitrogen and hydrogen doped silicon carbide layer directly beneath the first nonmetallic liner.

19. The semiconductor structure of claim 13, wherein a topmost surface of the first nitrogen and hydrogen doped silicon carbide layer is above a bottommost surface of the first nonmetallic liner.

* * * * *